(12) United States Patent
Jaklic et al.

(10) Patent No.: US 6,701,492 B2
(45) Date of Patent: Mar. 2, 2004

(54) METHOD FOR THE DETERMINATION OF RESISTANCES AND CAPACITANCES OF A CIRCUIT DIAGRAM, WHICH REPRESENTS AN ELECTRICAL CIRCUIT

(75) Inventors: Janez Jaklic, München (DE); Christoph Padberg, München (DE); Gerd Hildebrand, München (DE); Susanne Klee, München (DE)

(73) Assignees: Infineon Technologies AG, Munich (DE); Cadence Design Systems, Inc., San Jose, CA (US)

( * ) Notice: Subject to any disclaimer, the term of this patent is extended or adjusted under 35 U.S.C. 154(b) by 11 days.

(21) Appl. No.: 10/057,125

(22) Filed: Jan. 25, 2002

(65) Prior Publication Data

US 2002/0133793 A1 Sep. 19, 2002

(30) Foreign Application Priority Data

Jan. 25, 2001 (DE) .......................... 101 03 300

(51) Int. Cl.⁷ .............................................. G06F 17/50
(52) U.S. Cl. ................................. 716/4; 716/5; 716/6
(58) Field of Search ........................................ 716/1–21

(56) References Cited

U.S. PATENT DOCUMENTS

| | | | | |
|---|---|---|---|---|
| 5,359,534 A | * | 10/1994 | Fujiki et al. ................... | 716/6 |
| 5,379,231 A | * | 1/1995 | Pillage et al. .................. | 703/14 |
| 5,381,345 A | | 1/1995 | Takegami et al. ............. | 364/491 |
| 5,838,582 A | * | 11/1998 | Mehrotra et al. .............. | 716/5 |
| 5,896,300 A | * | 4/1999 | Raghavan et al. ............. | 716/10 |
| 5,999,726 A | * | 12/1999 | Ho ................................. | 716/11 |
| 6,128,768 A | | 10/2000 | Ho ................................. | 716/5 |
| 6,286,126 B1 | * | 9/2001 | Raghavan et al. ............. | 716/6 |
| 6,434,729 B1 | * | 8/2002 | Alpert et al. ................... | 716/6 |
| 6,438,729 B1 | * | 8/2002 | Ho ................................. | 716/1 |

OTHER PUBLICATIONS

Andrew B. Kahng et al.: "Two–pole Analysis of Interconnection Trees", 1994 IEEE Multi–Chip Module Conference, Los Alamitos, CA, IEEE Comput. Soc. Press, 1994, pp. 105–110.

Andrew B. Kahng et al.: "Optimal Equivalent Circuits for Interconnect Delay Calculations Using Moments", Proceedings EURO–DAC '94 with EURO–VHDL '94, New York, NY, ACM 1994, pp. 164–169.

* cited by examiner

*Primary Examiner*—Vuthe Siek
*Assistant Examiner*—Andrea Liu
(74) *Attorney, Agent, or Firm*—Laurence A. Greenberg; Werner H. Stemer; Gregory L. Mayback

(57) ABSTRACT

From a circuit diagram, an electrically connected circuit diagram network is selected. From a layout representing the circuit diagram, an electrically connected layout network is selected that represents the circuit diagram network. A first electrical terminal connection of a first component is selected that connects the first component with the circuit diagram network or with the layout network. A second electrical terminal connection of a second component is selected that connects the component with the circuit diagram network or with the layout network. A first electrical moment is calculated for the transmission path of the layout. A second moment of the corresponding transmission path of the circuit diagram is calculated. A relationship between the first moment and the second moment is predetermined. A value of a resistor or a value of the capacitor of the circuit diagram is now modified in such a way that the relationship is satisfied.

14 Claims, 3 Drawing Sheets

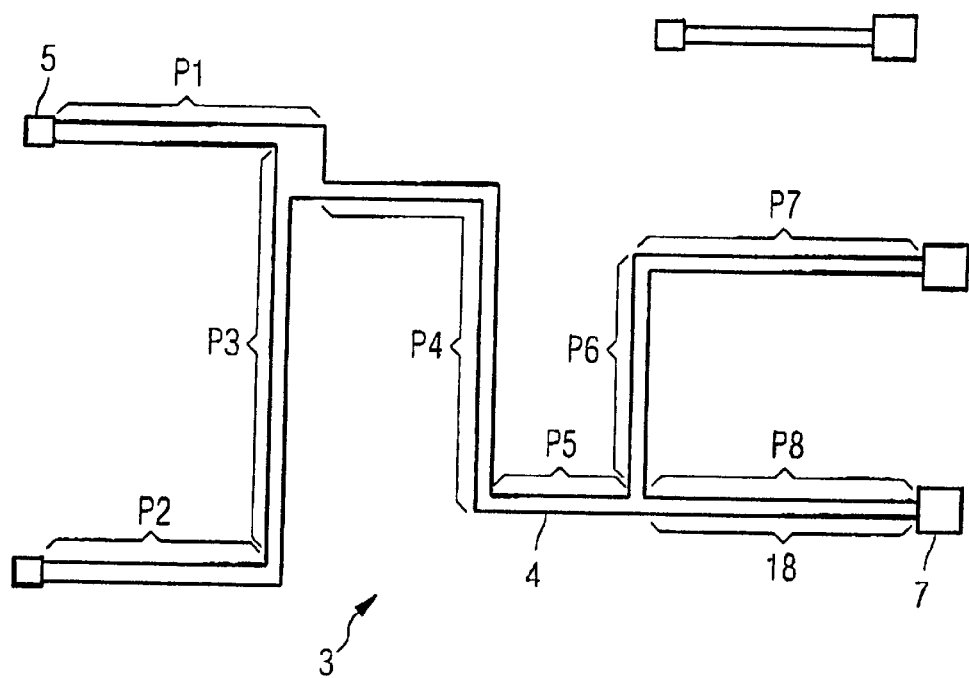

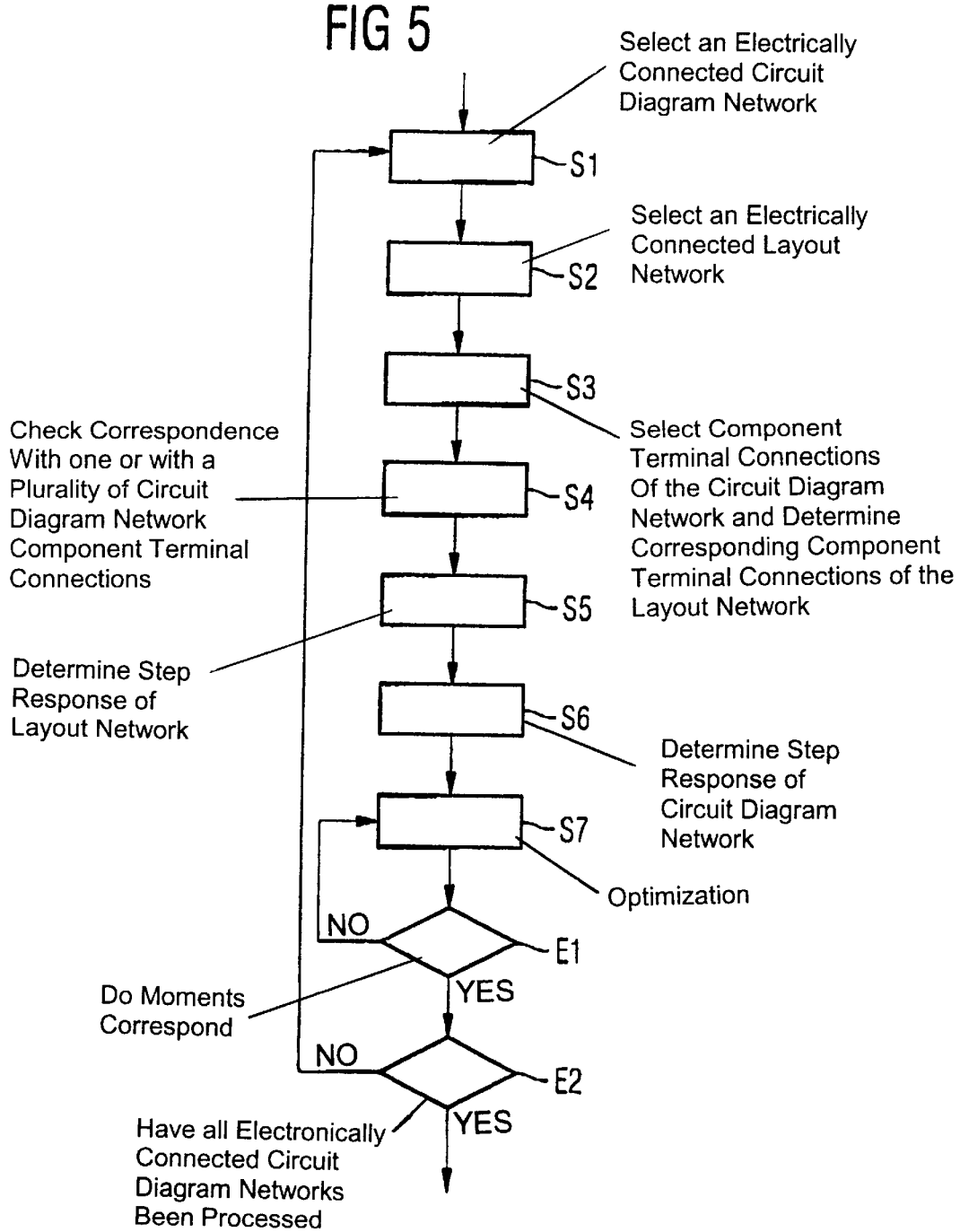

METHOD FOR THE DETERMINATION OF RESISTANCES AND CAPACITANCES OF A CIRCUIT DIAGRAM, WHICH REPRESENTS AN ELECTRICAL CIRCUIT

BACKGROUND OF THE INVENTION

Field of the Invention

The present patent application relates to a method for determining resistances and capacitances of a circuit diagram.

In producing an electrical semiconductor component, a large number of development steps are carried out, starting from an idea up to the finished product. One possibility for representing the conceived electrical circuit is producing a circuit diagram. Here resistors, capacitors, coils, transistors, diodes, etc., are arranged as electrical components and are connected by electrical lines. Here the electrical lines themselves have ideal properties, so that, for example, they have no resistance and no capacitance. In a subsequent development step, from the circuit diagram, a layout is produced that can be used to manufacture masks for the semiconductor production. In the layout, electrical lines are realized as real components. A line of the layout is for example fashioned as a metallic structure, whereby crossings and junctions, as well as contacts, are provided in metallization planes that are situated at higher or lower levels, which very probably have an electrical resistance and capacitance in relation to their surroundings. These parasitic resistances and capacitances cause delays in the electrical signals, which become more serious as the miniaturization of the components increases, and can even dominate the overall runtime of the signals. As a consequence, the delay time of the electrical connections in comparison to the delay time of the electrical components becomes more and more important. Because the delay time of the real electrical lines of the layout is not taken into account in the idealized electrical connections of the circuit diagram, it is necessary for circuit developers to insert additional parasitic resistances and capacitances into the circuit diagram, in order to simulate the electrical behavior of real lines. From the prior art, it is known that this is carried out by a circuit developer who makes a rough estimate of the parasitic capacitances and resistances. Here it is known that what are called $\pi$-equivalent circuits are used to simulate a real line. A $\pi$-equivalent circuit is made up of an electrical input and an electrical output, connected with one another with a resistor. In addition, both the input and the output are connected to a reference potential by a respective capacitor. A disadvantage of this method known from the prior art is that the values estimated by a circuit developer for the $\pi$-equivalent circuit often agree very poorly with the real layout, so that the weaknesses of the layout cannot be detected through the simulation of the circuit diagram.

Another method for extracting parasitic properties of a layout is indicated for example in U.S. Pat. No. 6,128,768. Here it is described how the parasitic properties of a layout can be extracted from this layout.

SUMMARY OF THE INVENTION

The object of the invention is to indicate a method that determines capacitances or resistances of a circuit diagram from a layout that represents the circuit diagram.

The method includes steps of:
providing a circuit diagram including a first component having a first electrical terminal connection, a second component having a second electrical terminal connection, a resistor, a capacitor, and an electrically connected circuit diagram network;
providing a layout representing the circuit diagram; in the layout, determining an electrically connected layout network representing the circuit diagram network;
using the first electrical terminal connection to connect the first component with the circuit diagram network;
in the layout network, determining a first electrical terminal connection corresponding to the first electrical terminal connection of the circuit diagram network;
using the second electrical terminal connection to connect the second component with the circuit diagram network;
in the layout network, determining a second electrical terminal connection corresponding to the second electrical terminal connection of the circuit diagram network;
in the layout, determining a first moment of a transmission path between the first electrical terminal connection and the second electrical terminal connection;
in the circuit diagram, determining a second moment of a transmission path of between the first electrical terminal connection and the second electrical terminal connection;
predetermining a relationship between the first moment and the second moment; and
choosing a value of a component, which is selected from the group consisting of the resistor and the capacitor, enabling the relationship to be satisfied.

With the inventive method, it is possible to extract the parasitic electrical behavior of a layout from the layout and to simulate it in a circuit diagram. In this way, the expected electrical behavior of a circuit that is represented in a circuit diagram can be calculated using improved values for the capacitances and resistances it contains. The invention advantageously makes it possible to easily simulate the electrical behavior of a layout, by means of simple resistances and capacitances. In addition, the simulation has a very high degree of precision, because the parasitic components are extracted from the layout.

A further construction of the invention provides that the value of the resistance or the value of the capacitance of the circuit diagram is iteratively optimized until the relationship is satisfied. The iterative method can for example be an optimization method for determining suitable resistance or capacitance values.

Another variant of the method provides that the relationship includes the property that the second moment is between 0.9 and 1.1 times as large as the first moment.

The indicated range for the relationship between the first moment and the second moment has the advantage that in this range, the agreement of the moments is sufficient for the electrical behavior to be simulated with sufficient precision.

A further advantageous construction of the inventive method provides that the first moment and the second moment are of the same order. This has the advantage that the moments can be compared with one another directly, so that the corresponding time response of the layout can be carried over into a time response of the circuit diagram. The order of the moments relates to the transient response between the first electrical terminal connection and the second electrical terminal connection. For example, a simple lowpass circuit having one resistor and one capacitor has only a first-order time response, which can be described by a decay time $\tau$ and which corresponds to a first-order moment. Correspondingly, a second-order or third-order lowpass likewise has moments in the transient response that are second- or third-order.

A further construction of the method provides that the first and second moment are both first-order. This has the advantage that the simulation of the time response can be limited to the first-order response, which reproduces, to a good approximation, the time response of the transmission path.

In addition, it is inventively provided that the resistor or the capacitor is a component of a π-equivalent circuit that connects an input node and an output node through a resistor. The π-equivalent circuit connects the input node and the output node to a reference potential through a respective capacitor. A π-equivalent circuit can easily simulate a parasitic line.

In addition, the inventive method provides that the connection in the layout between the first electrical terminal connection and the second electrical terminal connection is disassembled into layout subparts. Values of the resistance and of the capacitance of a π-equivalent circuit are determined from the geometry of a layout subpart. In this way, it is possible to describe each of the individual layout subparts through a π-equivalent circuit.

A further construction of the inventive method provides that the layout subpart is selected such that it has as an end point an electrical terminal connection to a component or a junction to at least two additional layout subparts. In this way, it is possible to represent individual printed conductors of the layout up to a junction, or to represent the terminal connection to a component through a π-equivalent circuit.

A further construction of the inventive method provides that the electrically connected layout network is simulated through π-equivalent circuits. This has the advantage that the layout can be calculated using simple π-equivalent circuits.

In addition, it is provided that the first moment of the transmission path between the first electrical terminal connection and the second electrical terminal connection in the layout is determined with the aid of the π-equivalent circuits.

In addition, it is provided that the first and second moment are determined by registering the transmission response, at the second or first electrical terminal connection, to a step voltage applied at the first or second electrical terminal connection, and transforming this response from the time domain into the frequency domain, and calculating a moment by means of integration.

In addition, it is provided that the iterative optimization is carried out using a gradient method.

A further construction of the inventive method provides that the value of the resistor already situated in the circuit diagram, or the value of the capacitor, is adapted to the moments extracted from the layout.

A further advantageous construction of the inventive method provides that the first moment extracted from the layout is used to add an additional resistor or an additional capacitor to the circuit diagram.

BRIEF DESCRIPTION OF THE DRAWINGS

FIG. 4 shows the layout of an electrically connected layout network that reproduces the electrically connected circuit diagram network from FIG. 1; and FIG. 5 shows a flow diagram for the illustration of the method.

DESCRIPTION OF THE PREFERRED EMBODIMENTS

Figure 1:
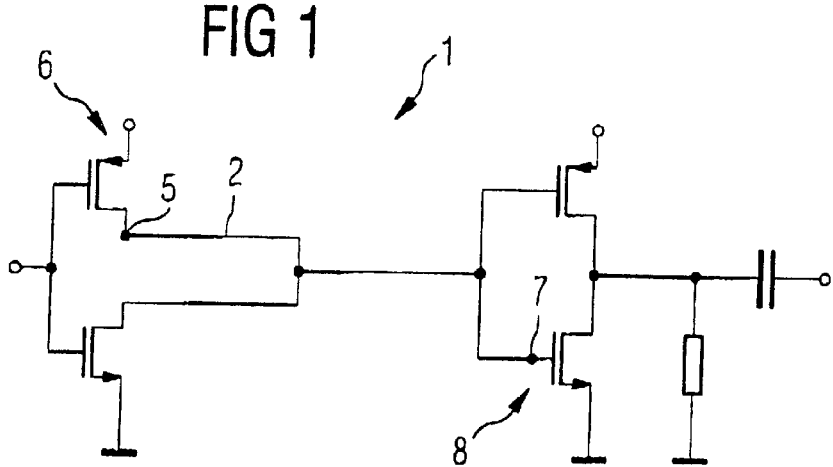
FIG. 1 shows a circuit diagram having an electrically connected circuit diagram network.

FIG. 1 shows a circuit diagram 1. The circuit diagram 1 has an electrically connected circuit diagram network 2. The electrically connected circuit diagram network 2 connects the first electrical terminal connection 5 of a first component 6 with a second electrical terminal connection 7 of a second component 8. The electrical lines, shown in FIG. 1, of the electrically connected circuit diagram network 2 are ideal lines, which themselves have no parasitic capacitances or resistances.

Figure 2:
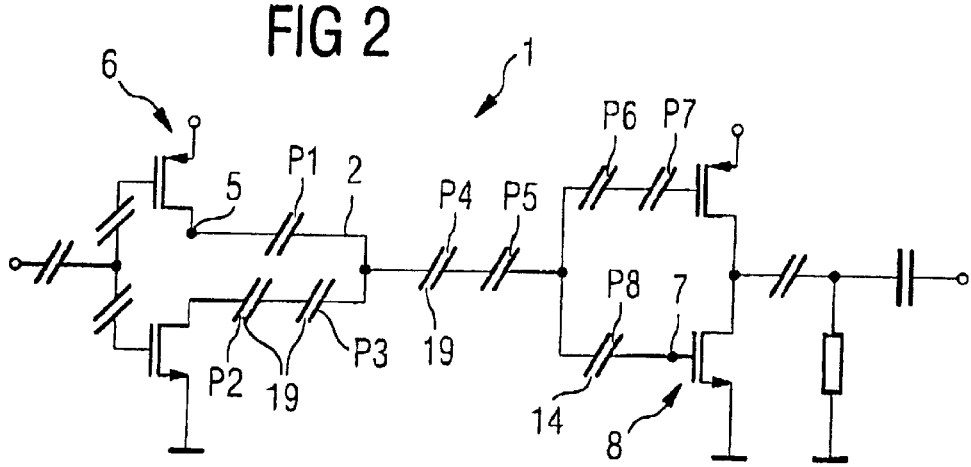
FIG. 2 shows the circuit diagram from FIG. 1, whereby in addition, π-equivalent circuits have been added that are suitable for the simulation of the parasitic behavior of electrical lines.

In FIG. 2, the circuit diagram 1 from FIG. 1 is shown, and has been expanded by π-equivalent circuits 19. Here again, the electrically connected circuit diagram network 2 connects the first electrical terminal connection 5 of first component 6 with the second electrical terminal connection 7 of the second component 8. Here, the second electrical terminal connection 7 is connected with a π-equivalent circuit 14, or P8. In addition, π-equivalent circuits P1, P2, P3, P4, P5, P6, and P7 are present.

Figure 3:
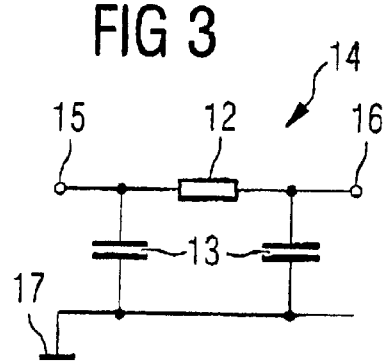
FIG. 3 shows the circuit diagram of a π-equivalent circuit.

FIG. 3 shows a π-equivalent circuit 14. The π-equivalent circuit 14 has an input node 15 and an output node 16 that are connected with one another by means of a resistor 12. In addition, the input node 15 and the output node 16 are each connected, with a capacitor 13, to a reference potential 17.

In FIG. 4, a layout 3 is shown that has an electrically connected layout network 4. The electrically connected layout network 4 represents the electrically connected circuit diagram network 2 from FIG. 2. The electrically connected layout network 4 also has a first electrical terminal connection 5 and a second electrical terminal connection 7. The electrically connected layout network 4 can be disassembled into layout subparts, whereby a layout subpart 18 is shown that is connected to second electrical terminal connection 7 and is represented by π-equivalent circuit P8. For example, π-equivalent circuits P1, P2, P3, P4, P5, P6, P7, and P8, shown in FIG. 2, can be identified in layout 3.

In FIG. 5, a schematic flow diagram for the inventive method is shown. In a first step S1, from circuit diagram 1, an electrically connected circuit diagram network 2 is selected that contains a π-equivalent circuit. In a second step S2, an electrically connected layout network 4 is selected that corresponds to the electrically connected circuit diagram network 2. For the corresponding layout network 4, the relevant parasitic resistances and capacitances are determined. In a subsequent third method step S3, all of the component terminal connections of circuit diagram network 2 are selected, and respectively corresponding component terminal connections of layout network 4 are determined. In the subsequent fourth step S4, it is checked whether a plurality of layout network component terminal connections correspond to one or to a plurality of circuit diagram network component terminal connections. If this is the case, a representative connection is selected. In the following fifth method step S5, the step response to a voltage jump is calculated and stored for all pairs of component terminal connections i,j of the layout network. From the step responses, the moments of the respective step response k for k=1–n are calculated, where n is the maximum order of the moments. Moments M(i,j,k) are calculated and stored. A method for calculating the moments provides, for example, that corresponding time integrals are solved. A further method for calculating the moments provides that direct calculations of matrices are carried out, for example by means of the exact diagonalization of the matrix, or using the LANCZOS method.

In a subsequent sixth method step S6, the step response is calculated for all pairs of component terminal connections i,j of the circuit diagram network 2, with initial values for the resistances and capacitances of the circuit diagram. In addition, moments m(i,j,k,0) are calculated for the step response of the circuit diagram. The last index is selected to be 0, because these are initial values.

In a subsequent seventh method step S7, the values for the resistances and capacitances of the circuit diagram network are improved using an optimization method. For this purpose, a gradient method is, for example, suitable.

Subsequently, in decision step E1 it is decided whether the resistances and capacitances of circuit diagram network 2 are selected such that the moments of the step response of the layout correspond to the moments of the step response of the circuit diagram, within a small deviation. If this is not the case, the seventh step S7 is repeated. If this is the case, then in the next decision step E2, it is decided whether all electrically connected circuit diagram networks of the circuit diagram 1 have already been processed. If this is not the case, the method continues with the first step S1, whereby the next circuit diagram network is selected. Otherwise the method is terminated.

We claim:

1. A method for determining resistances and capacitances of a circuit diagram, the method which comprises:

providing a circuit diagram including a first component having a first electrical terminal connection, a second component having a second electrical terminal connection, a resistor, a capacitor, and an electrically connected circuit diagram network;

providing a layout representing the circuit diagram;

in the layout, determining an electrically connected layout network representing the circuit diagram network;

using the first electrical terminal connection to connect the first component with the circuit diagram network;

in the layout network, determining a first electrical terminal connection corresponding to the first electrical terminal connection of the circuit diagram network;

using the second electrical terminal connection to connect the second component with the circuit diagram network;

in the layout network, determining a second electrical terminal connection corresponding to the second electrical terminal connection of the circuit diagram network;

in the layout, determining a first moment of a transmission path between the first electrical terminal connection and the second electrical terminal connection;

in the circuit diagram, determining a second moment of a transmission path of between the first electrical terminal connection and the second electrical terminal connection;

predetermining a relationship between the first moment and the second moment; and choosing a value of a component, which is selected from the group consisting of the resistor and the capacitor, enabling the relationship to be satisfied.

2. The method according to claim 1, which comprises:

iteratively optimizing the value of the component until the relationship is satisfied.

3. The method according to claim 1, wherein:

the relationship is that the second moment is between 0.9 and 1.1 times as large as the first moment.

4. The method according to claim 1, wherein:

the first moment has an order; and the second moment has an order equal to the order of the first moment.

5. The method according to claim 1, wherein:

the first moment is of a first order; and the second moment is of a first order.

6. The method according to claim 1, wherein:

choosing a component selected from the group consisting of the resistor and the capacitor to be a component of a π-equivalent circuit; and configuring the π-equivalent circuit to connect an input node and an output node through a resistance, to connect the input node to a reference potential through a capacitance, and to connect the output node to the reference potential through a capacitance.

7. The method according to claim 1, which comprises:

in the layout, disassembling a connection between the first electrical terminal connection and the second electrical terminal connection into layout subparts;

determining values of resistances and capacitances of a π-equivalent circuit from a geometry of one of the layout subparts.

8. The method according to claim 7, which comprises:

selecting the one of the layout subparts to have an end point connected to an element selected from the group consisting of an electrical terminal connection to a component and a junction to at least two further layout subparts.

9. The method according to claim 1, which comprises:

using π-equivalent circuits to simulate the electrically connected layout network.

10. The method according to claim 1, which comprises:

using π-equivalent circuits to determine the first moment of the transmission path between the first electrical terminal connection and the second electrical terminal connection in the layout.

11. The method according to claim 1, which comprises:

determining the first moment and the second moment by registering a transmission response selected from the group consisting of a response at the second electrical terminal connection to a step voltage applied to the first electrical terminal connection and a response at the first electrical terminal connection to a step voltage applied to the second electrical terminal connection;

transforming the transmission response from a time domain into a frequency domain; and integrating to calculate a moment.

12. The method according to claim 1, which comprises:

using a gradient method to iteratively optimize the value of the component until the relationship is satisfied.

13. The method according to claim 1, which comprises:

adapting a value of a component, which is selected from the group consisting of the resistor and the capacitor, to the first moment extracted from the layout.

14. The method according to claim 1, которая comprises:

using the first moment that has been extracted from the layout to add an additional component to the circuit diagram;

selecting the additional component from the group consisting of a resistor and a capacitor.

* * * * *